United States Patent
Tan et al.

(10) Patent No.: US 9,437,324 B2
(45) Date of Patent: Sep. 6, 2016

(54) SHIFT REGISTER UNIT, DRIVING METHOD THEREOF, SHIFT REGISTER AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Wen Tan, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 107 days.

(21) Appl. No.: 14/359,856

(22) PCT Filed: Nov. 21, 2013

(86) PCT No.: PCT/CN2013/087574
§ 371 (c)(1),
(2) Date: May 21, 2014

(87) PCT Pub. No.: WO2015/018141
PCT Pub. Date: Feb. 12, 2015

(65) Prior Publication Data
US 2015/0043703 A1 Feb. 12, 2015

(30) Foreign Application Priority Data
Aug. 9, 2013 (CN) .......................... 2013 1 0347123

(51) Int. Cl.
*G11C 19/00* (2006.01)
*G11C 19/18* (2006.01)
(Continued)

(52) U.S. Cl.
CPC ............. *G11C 19/184* (2013.01); *G11C 19/28* (2013.01); *G09G 3/3266* (2013.01); *G09G 2310/0286* (2013.01)

(58) Field of Classification Search
None
See application file for complete search history.

(56) References Cited

U.S. PATENT DOCUMENTS

| 5,949,398 A | * | 9/1999 | Kim | ...................... G09G 3/3655 345/100 |
| 7,612,754 B2 | * | 11/2009 | Kuo | ...................... G09G 3/3677 345/100 |

(Continued)

FOREIGN PATENT DOCUMENTS

| CN | 101783124 A | 7/2010 |
| CN | 103021360 A | 4/2013 |

(Continued)

OTHER PUBLICATIONS

Second Chinese Office Action of application No. 201310347123.8, dated Jul. 24, 2015. Translation provided by Dragon Intellectual Property Law Firm.

(Continued)

*Primary Examiner* — Tuan T Lam
(74) *Attorney, Agent, or Firm* — Harness, Dickey & Pierce, P.L.C.

(57) ABSTRACT

Embodiments of the present invention provides a shift register unit, driving method thereof, a shift register and a display device. A switch-off module is provided to disconnect electrical connections between a pull-up node and a precharge module and between the pull-up node and a pull-down module at a pull-up stage. As a result, it is able to prevent excessive electric leakage of a GOA circuit, thereby to improve the reliability and power consumption of the GOA circuit with an Oxide TFT.

17 Claims, 18 Drawing Sheets

(51) Int. Cl.
*G11C 19/28* (2006.01)
*G09G 3/32* (2016.01)

(56) References Cited

U.S. PATENT DOCUMENTS

| | | | | |
|---|---|---|---|---|
| 8,605,027 | B2* | 12/2013 | Pak | G09G 3/3677 315/169.2 |
| 8,952,943 | B2* | 2/2015 | Chung | G09G 3/3266 345/204 |
| 2004/0227718 | A1 | 11/2004 | Park | |
| 2006/0056267 | A1* | 3/2006 | Kim | G09G 3/3677 365/230.06 |
| 2007/0274433 | A1* | 11/2007 | Tobita | G09G 3/3677 377/64 |
| 2009/0303211 | A1* | 12/2009 | Hu | G11C 19/28 345/204 |
| 2011/0116592 | A1* | 5/2011 | Tsai | G11C 19/184 377/79 |
| 2012/0098804 | A1* | 4/2012 | Ohhashi | G09G 3/3685 345/204 |
| 2012/0139599 | A1* | 6/2012 | Chen | G09G 3/3677 327/203 |
| 2014/0023173 | A1* | 1/2014 | Miyake | G11C 19/188 377/54 |
| 2014/0103983 | A1 | 4/2014 | Chang et al. | |
| 2015/0302934 | A1* | 10/2015 | Qi | G11C 19/28 377/54 |

FOREIGN PATENT DOCUMENTS

| | | | |
|---|---|---|---|
| CN | 103035218 | A | 4/2013 |
| CN | 103050106 | A | 4/2013 |
| CN | 103077689 | A | 5/2013 |
| CN | 103226927 | A * | 7/2013 |
| CN | 203366700 | U | 12/2013 |

OTHER PUBLICATIONS

Written Opinion of the International Searching Authority for international application No. PCT/CN2013/087574.
Chinese Office Action dated Feb. 4, 2015 regarding application No. 201310347123.8. Translation provided by Dragon Intellectual Property Law Firm.
International Search Report and Written Opinion dated May 14, 2014.

* cited by examiner

SHIFT REGISTER UNIT, DRIVING METHOD THEREOF, SHIFT REGISTER AND DISPLAY DEVICE

CROSS-REFERENCE TO RELATED APPLICATION

This application is the U.S. national phase of PCT Application No. PCT/CN2013/087574 filed on Nov. 21, 2013, which claims priority to Chinese Patent Application No. 201310347123.8 filed on Aug. 9, 2013, the disclosures of which are incorporated in their entirety by reference herein.

TECHNICAL FIELD

The present invention relates to the field of display technology, in particular to a shift register unit, driving method thereof, a shift register, and a display device.

BACKGROUND

Oxide thin film transistor (Oxide TFT) is a development direction of the large-scale, active matrix organic light-emitting diode (AMOLED) display/liquid crystal display (LCD), so it is widely adopted for an existing gate on array (GOA).

As one feature of the Oxide TFT, it is capable of being depleted, i.e., a threshold voltage of the Oxide TFT may be negative. As a result, there is always leakage current for the existing GOA.

For an existing typical GOA circuit as shown in FIG. 1, at a precharge stage, there is relatively serious electric leakage at T14, so the charging effect of a gate electrode of T11 becomes worse. At a pull-up stage, a minimum level of gate electrodes of T12, T13 and T14 is merely $V_{GL}$ while the level of source electrodes of T12, T13 and T14 is $V_{GL}$ too, so a minimum gate-to-source voltage $V_{GS}$ of T12, T13 and T14 is 0. The threshold voltage of the Oxide TFT is less than 0, so T12, T13 and T14 still are in a lightly-on state, and there is relatively large leakage current. As a result, both the gate electrode and the source electrode of T11 have an electric leakage toward $V_{GL}$, and the normal pull-up and output of the GOA circuit will be affected. At a pull-down stage, T12 and T14 cannot be switched off normally, so that the pull-down waveform is distorted and the pull-down effect is affected, thereby the reliability and power consumption of the GOA circuit is affected.

SUMMARY

An embodiment of the present invention provides a shift register unit, a driving method thereof, a shift register and a display device, so as to prevent excessive electric leakage of a GOA circuit, thereby to improve the reliability and power consumption of the GOA circuit with an Oxide TFT.

In one aspect, an embodiment of the present invention provides a shift register unit, comprising a first capacitor, a pull-up module, a precharge module and a pull-down module. A first end of the first capacitor is coupled to the pull-up module at a pull-up node. The shift register unit further comprises a switch-off module coupled to the pull-up node and to a first node located between the precharge module and the pull-down module, so as to disconnect electrical connections between the pull-up node and the precharge module and between the pull-up node and the pull-down module at a pull-up stage.

Alternatively, the switch-off module comprises: a first TFT, a source electrode of which is coupled to the first node, a gate electrode of which is coupled to a second clock signal input, and a drain electrode of which is coupled to the pull-up node; and a switch-off controlling unit configured to control a source voltage of the first TFT at the pull-up stage so as to enable the first TFT to be in a fully off state, thereby to disconnect the electrical connections between the pull-up node and the precharge module and between the pull-up node and the pull-down module.

Alternatively, the switch-off controlling unit comprises a feedback capacitor, a first end of which is coupled to the source electrode of the first TFT, and a second end of which is coupled to the pull-up module and the pull-down module.

Alternatively, the switch-off controlling unit further comprises a second TFT, a source electrode of which is coupled to the pull-up module and the pull-down module, a gate electrode of which is coupled to the first clock signal input, and a drain electrode of which is coupled to the source electrode of the first TFT.

Alternatively, the switch-off controlling unit further comprises a second TFT, a source electrode of which is coupled to the pull-up module and the pull-down module, a gate electrode of which is coupled to the source electrode of the second TFT, and a drain electrode of which is coupled to the source electrode of the first TFT.

Alternatively, the switch-off module comprises the first TFT, the second TFT, and a third TFT. The source electrode of the first TFT is coupled to the drain electrode of the second TFT and a drain electrode of the third TFT, the gate electrode of the first TFT is coupled to a second clock signal input, and the drain electrode of the first TFT is coupled to the pull-up node. The source electrode of the second TFT is coupled to the pull-up module and the pull-down module, and the gate electrode of the second TFT is coupled to the first clock signal input. A source electrode of the third TFT is coupled to the first node, and a gate electrode of the third TFT is coupled to the second clock signal input.

Alternatively, the pull-up module comprises a fourth TFT, a source electrode of which is coupled to the first clock signal input, a gate electrode of which is coupled to the pull-up node, and a drain electrode of which is coupled to the second end of the first capacitor, the pull-down module and a signal output.

Alternatively, the pull-up module comprises the fourth TFT and a fifth TFT. The source electrode of the fourth TFT is coupled to a source electrode of the fifth TFT and the first clock signal input. The gate electrode of the fourth TFT is coupled to a gate electrode of the fifth TFT and the pull-up node. The drain electrode of the fourth TFT is coupled to a gate signal output, the second end of the first capacitor and the pull-down module. A drain electrode of the fifth TFT is coupled to the switch-off module, the pull-down module and a start signal output.

Alternatively, the precharge module comprises a sixth TFT, a source electrode and a gate electrode of which are coupled to a start signal input, and a drain electrode of which is coupled to the switch-off module and the pull-down module.

Alternatively, the pull-down module comprises a seventh TFT, an eighth TFT, a ninth TFT, and a pull-down controlling unit configured to control an on or off state of the seventh, eighth and ninth TFTs. A source electrode of the seventh TFT is coupled to the precharge module and the switch-off module, a gate electrode of the seventh TFT is coupled to the control unit, a gate electrode of the eighth TFT and a gate electrode of the ninth TFT at the pull-down node, and a drain electrode of the seventh TFT is coupled to a signal level signal input. A source electrode of the eighth TFT is coupled to the pull-up module, the switch-off module and the start signal output, and a drain electrode of the eighth TFT is coupled to the first level signal input. A source electrode of the ninth TFT is coupled to the pull-up module, the second end of the first capacitor, and the gate signal output, and a drain electrode of the ninth TFT is coupled to a second level signal input.

Alternatively, a potential of an input signal from the second level signal input is less than 0 and greater than a potential of an input signal from the first level signal input.

In another aspect, an embodiment of the present invention provides a method for driving a shift register unit, comprising: at a precharge stage, pulling up a pull-up node and a first node to a first potential, and enabling a switch-off module to be in an on state; at a pull-up stage, pulling up the pull-up node and the first node to a second potential greater than the first potential, enabling the switch-off module to be in a fully off state, and disconnecting electrical connections between the pull-up node and a precharge module and between the pull-up node and a pull-down module; at a resetting stage, enabling the switch-off module to be in the on state, and pulling down the pull-up node and the first node to a third potential less than the first potential; and at a resetting-maintaining stage, enabling the switch-off module to be in the off state, and maintaining the pull-up node and the first node at the third potential.

Alternatively, at the precharge stage, a low level signal is input by a first clock signal input, a high level signal is input by a second clock signal input, and a high level signal is input by a start signal input; at the pull-up stage, a high level signal is input by the first clock signal input, a low level signal is input by the second clock signal input, and a low level signal is input by the start signal input; at the resetting stage, a low level signal is input by the first clock signal input, a high level signal is input by the second clock signal input, and a low level signal is input by the start signal input; and at the resetting-maintaining stage, a high level signal is input by the first clock signal input, a low level signal is input by the second clock signal input, and a low level signal is input by the start signal input.

In yet another aspect, an embodiment of the present invention provides a shift register comprising multi-levels of the above-mentioned shift register unit.

In yet another aspect, an embodiment of the present invention provides a display device comprising the above mentioned multi-levels of shift t register unit.

According to the shift register unit, the driving method thereof, the shift register and the display device of the present invention, the switch-off module is provided to disconnect the electrical connections between the pull-up node and the precharge module and between the pull-up node and the pull-down module at the pull-up stage. As a result, it is able to prevent excessive electric leakage of the GOA circuit, thereby to improve the reliability and power consumption of the GOA circuit with an Oxide TFT.

DETAILED DESCRIPTION

To make the objects, the technical solutions and the advantages of the present invention more apparent, the present invention will be described hereinafter in a clear and complete manner in conjunction with the drawings. Obviously, the followings are merely a part of, rather than all of, the embodiments of the present invention, and all the other embodiments obtained by a person skilled in the art on the basis of the following embodiments shall also fall within the scope of the present invention.

Unless otherwise defined, all the technical or scientific terms used herein shall have the common meanings that can be understood by an ordinary person skilled in the art. Such words as "first" and "second" in the specification and the attached claims are merely used to distinguish the components from each other but do not refer to any order, number and significance. Similarly, such expressions as "one" and "an/a" are used to indicate that there is at least one component, but are not used to limit the number thereof. Such words as "couple" may include electrical connection, either direct or indirect, but are not limited to physical or mechanical connection. Such words as "on/above", "under/below", "left" and "right" are merely used to represent a relative position, and when an absolute position of an object is changed, the relative position thereof will be changed too.

Figure 1:
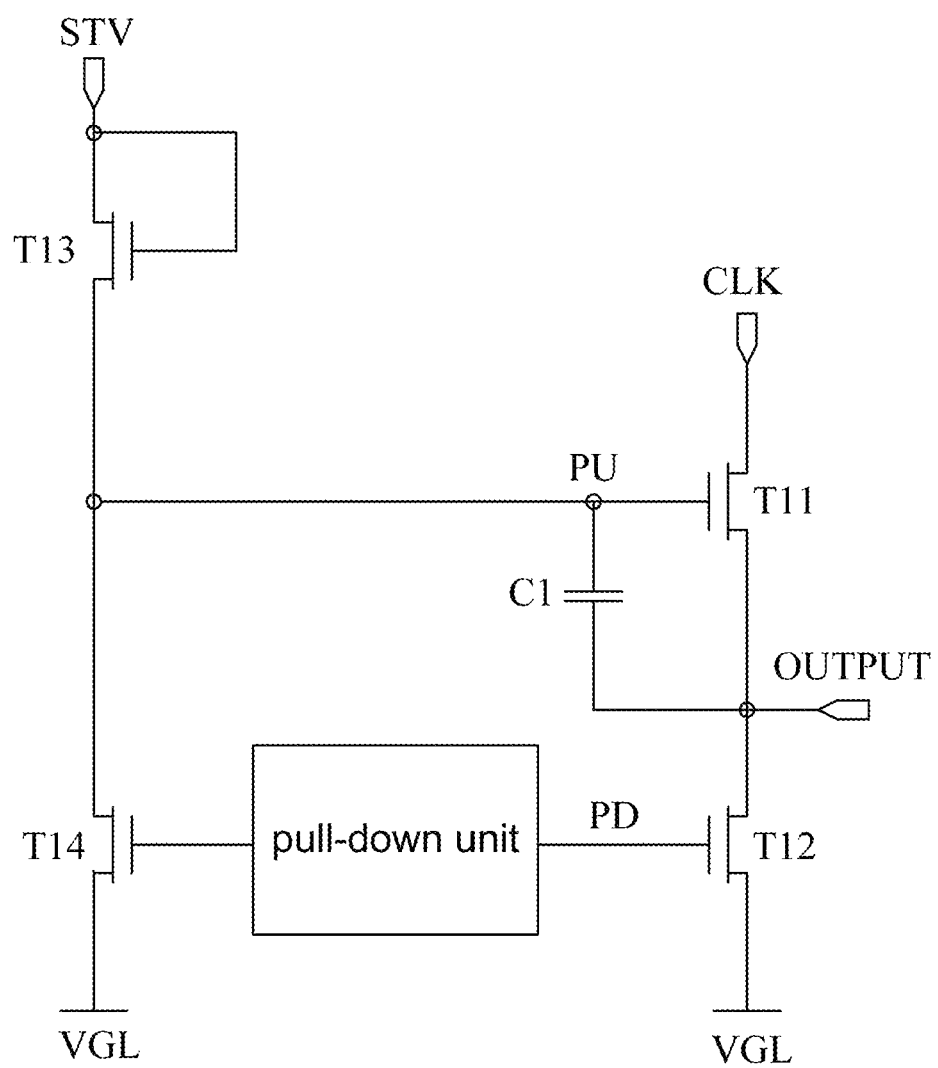
FIG. 1 is a schematic view of a shift register unit in the prior art.
Figure 2:
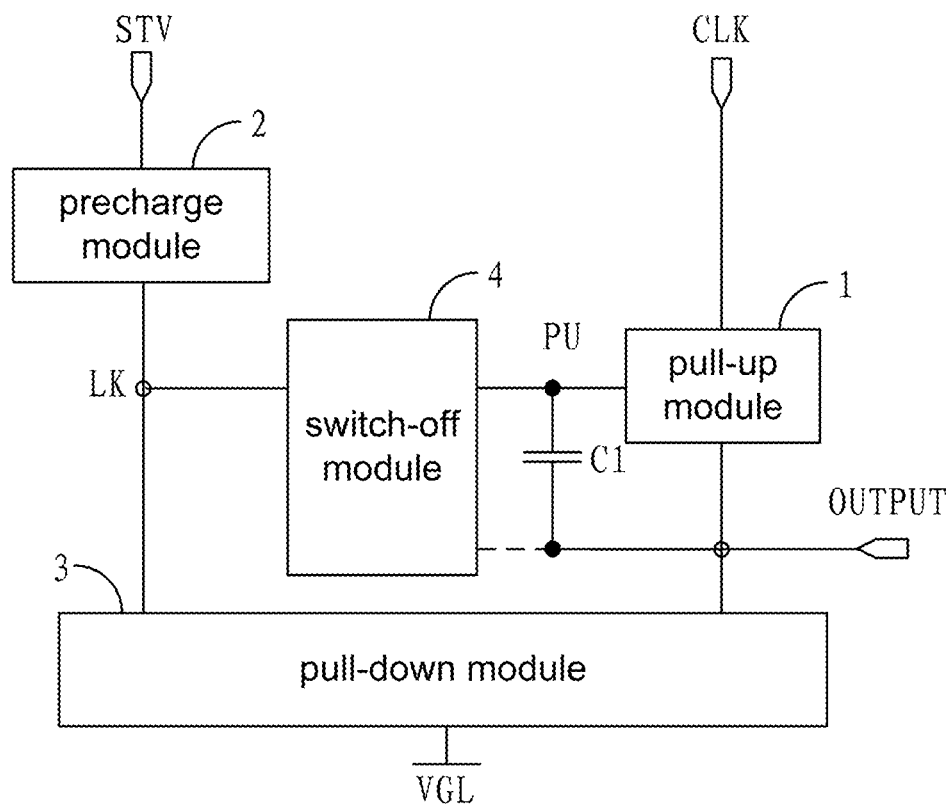
FIG. 2 is a schematic view of a shift register unit according to an embodiment the present invention.

An embodiment of the present invention provides a shift register unit which, as shown in FIG. 2, comprises a first capacitor C1, a pull-up module 1, a precharge module 2 and a pull-down module 3. A first end of the first capacitor C1 is coupled to the pull-up module 1 at a pull-up node PU.

The shift register unit further comprises a switch-off module 4 coupled to the pull-up node PU and to a first node LK located between the precharge module 2 and the pull-down module 3, so as to disconnect electrical connections between the pull-up node PU and the precharge module 2 and between the pull-up node PU and the pull-down module 3 at a pull-up stage.

At the pull-up stage, the shift register unit can fully disconnect the electrical connections between the pull-up node PU and the precharge module 2 and between the pull-up node PU and the pull-down module 3, so as to prevent excessive electric leakage of a GOA circuit, thereby to improve the reliability and power consumption of the GOA circuit with an Oxide TFT.

In FIG. 2, the dotted line between the switch-off module 4 and a second end of the first capacitor C1 is used to represent the presence or absence of the electrical connection between the switch-off module 4 and the second end of the first capacitor C1 in different embodiments.

Figure 3:
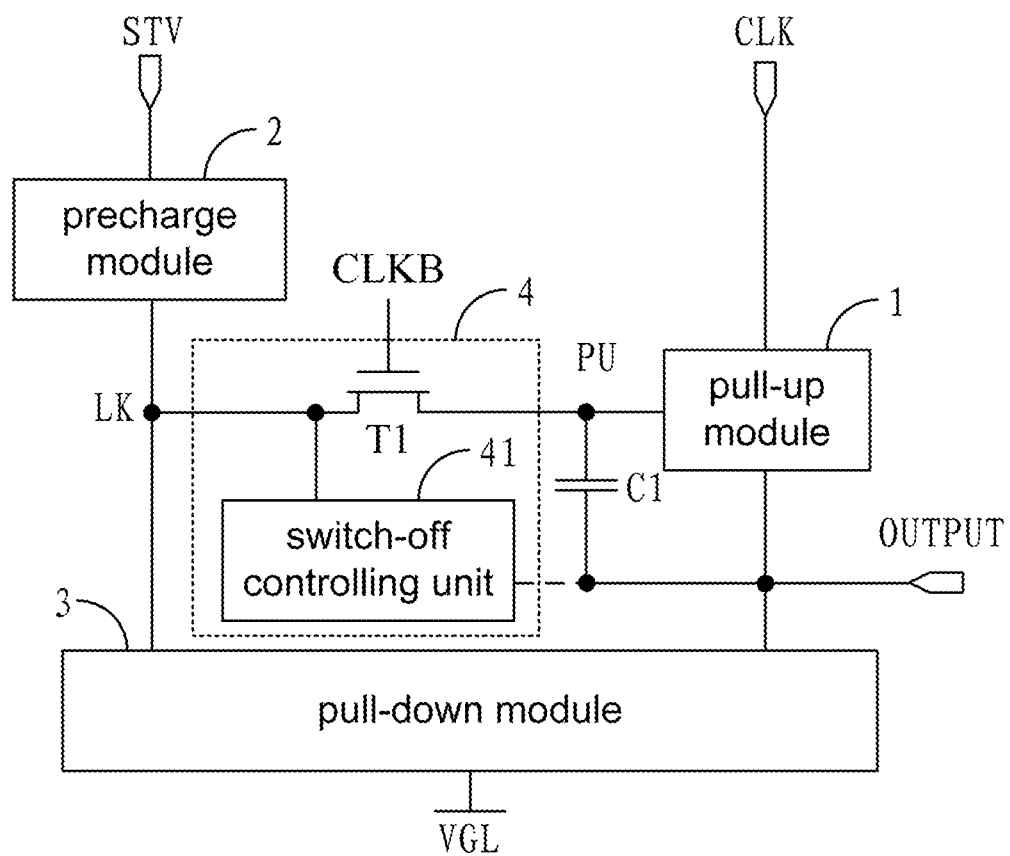
FIG. 3 is another schematic view of the shift register unit according to an embodiment of the present invention.

In one embodiment, as shown in FIG. 3, the switch-off module 4 may comprise: a first TFT T1, i.e., a switch-off TFT, a source electrode of the first TFT T1 is coupled to the first node LK, a gate electrode of the first TFT T1 is coupled to a second clock signal input CLKB, and a drain electrode of the first TFT T1 is coupled to the pull-up node PU; and a switch-off controlling unit 41 configured to control a source voltage of the first TFT T1 at the pull-up stage so that the first TFT T1 is in a fully off state, thereby to disconnect the electrical connections between the pull-up node PU and the precharge module 2 and between the pull-up node PU and the pull-down module 3.

Figure 4:
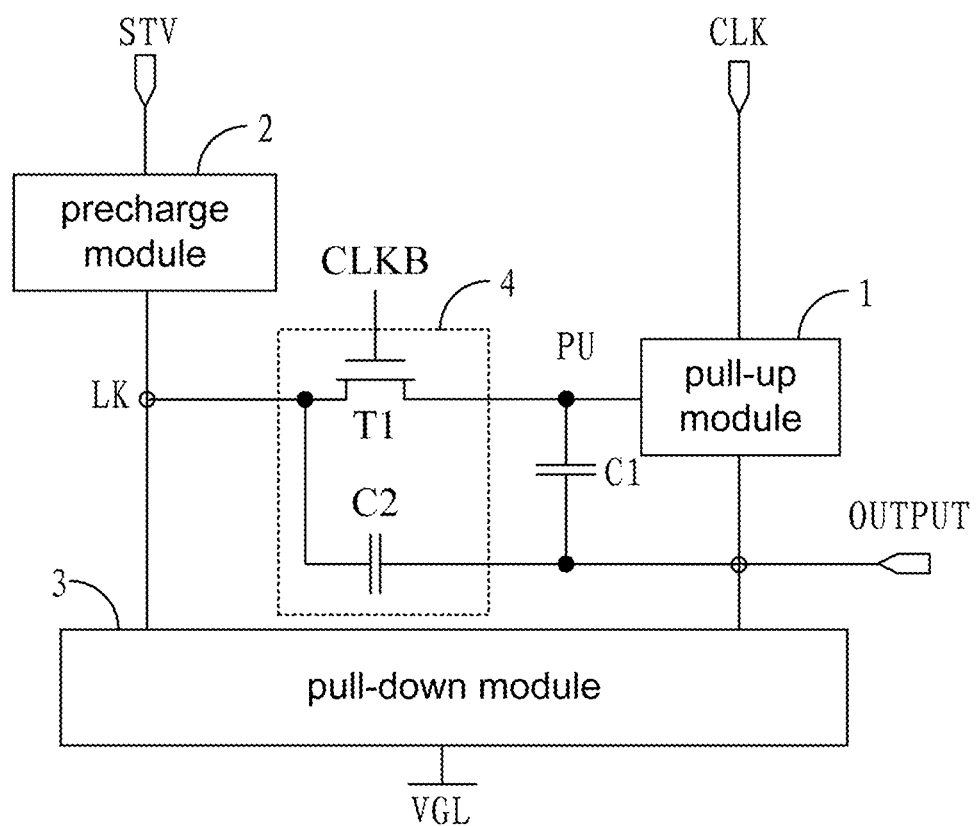
FIG. 4 is yet another schematic view of the shift register unit according to an embodiment of the present invention.

In another embodiment, as shown in FIG. 4, the switch-off controlling unit 41 may comprise a feedback capacitor C2, a first end of the feedback capacitor C2 is coupled to the source electrode of the first TFT T1, and a second end of the feedback capacitor C2 is coupled to the pull-up module 1 and the pull-down module 3.

Figure 9:
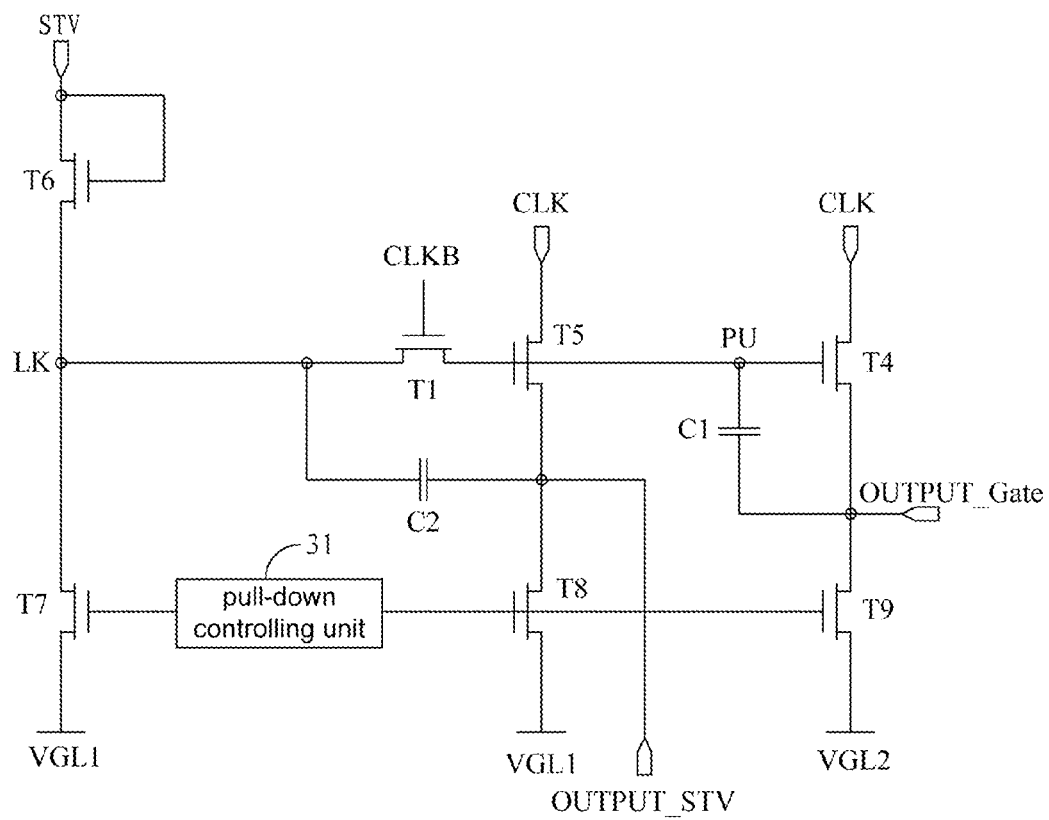
FIG. 9 is yet another schematic view of the shift register unit according to an embodiment of the present invention.

In addition, in an alternative embodiment, the second end of the feedback capacitor C2 may be coupled to the second end of the first capacitor C1 and a gate signal output OUTPUT_Gate (i.e., OUTPUT as shown in FIG. 4), or to a start signal output OUTPUT_STV (as shown in FIG. 9).

Figure 5:
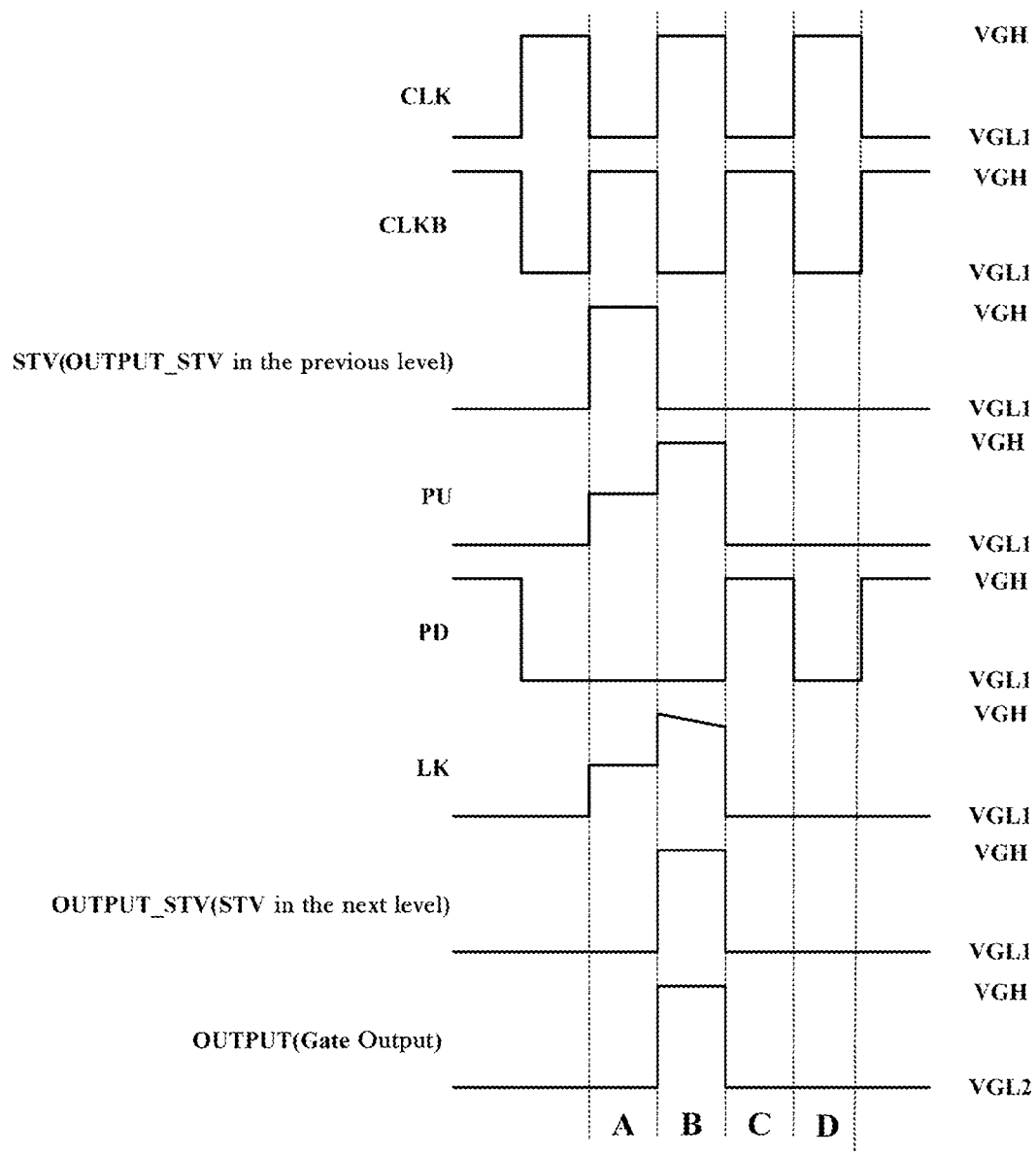
FIG. 5 is a sequence diagram showing signals used for the shift register unit according to an embodiment of the present invention.

When there is an input signal sequence as shown in FIG. 5, the working process of the shift register unit is described as follows.

At a precharge stage, i.e., stage A, a high level signal is input by the second clock signal input CLKB, the first TFT T1 is in an on state, the pull-up node PU and the first node LK are pulled up to a high potential, a low level signal is input by a first clock signal input CLK, a low level signal is output by a signal output OUTPUT, and a voltage at the first end of the feedback capacitor C2, i.e., at the first node LK, is $V_{GH}-V_{GL}$.

At the pull-up stage, i.e., stage B (also called as an output stage), a low level signal is input by the second clock signal input CLKB, the first TFT T1 is in an off state, a high level signal is input by the first clock signal input CLK, a high level signal is output by the signal output OUTPUT, a voltage across the feedback capacitor C2 remains unchanged, and the first node LK is pulled up to a higher potential like the pull-up node PU. At this time, the voltage at the first node LK is $2V_{GH}-V_{GL}$, so a gate-to-source voltage $V_{GS}$ of the first TFT T1 is $V_{GS}=V_{GL}-(2V_{GH}-V_{GL})=2V_{GL}-2V_{GH}$. $V_{GL}$ is about −8V, $V_{GH}$ is about 5V and a threshold voltage $V_{TH}$ of the first TFT T1 is about −1V, so the gate-to-source voltage $V_{GS}$ of the first TFT T1 is approximately equal to $-26V<V_{TH}<0$, i.e., a deeply negative voltage. Hence, the first TFT T1 is fully switched off, i.e., in a fully off state, and the electrical connection between the pull-up node PU and the first node LK, i.e., the electrical connections between the pull-up node PU and the precharge module 2 and between the pull-up node PU and the pull-down module 3, is fully discoupled. As a result, it is able to prevent an incompletely off state of the precharge module 2 and the pull-down module 3 as well as excessive electric leakage due to the depletion features of the TFT, thereby to prevent a failed GOA circuit due to the distortion of the pull-up node PU and of the output waveform of the signal output OUTPUT.

Figure 6:
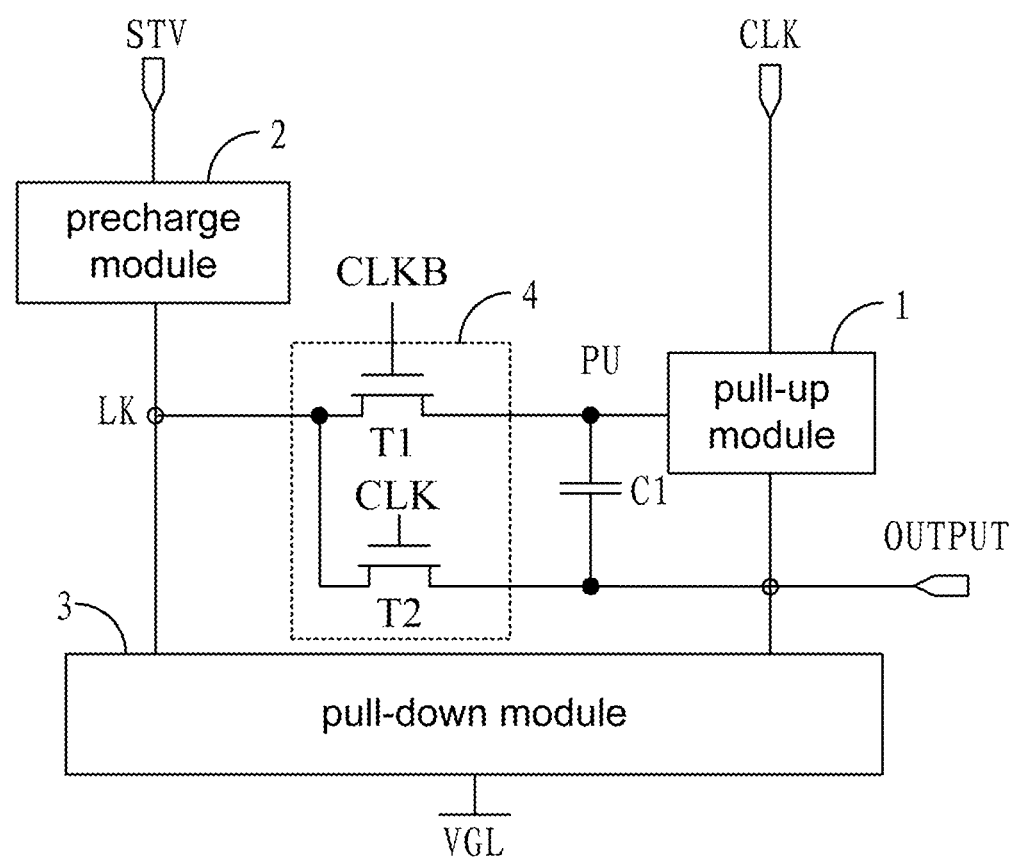
FIG. 6 is yet another schematic view of the shift register unit according to an embodiment of the present invention.

In another embodiment, as shown in FIG. 6, the switch-off controlling unit 41 may further comprises a second TFT T2, a source electrode of the second TFT T2 is coupled to the pull-up module 1 and the pull-down module 3, a gate electrode of the second TFT T2 is coupled to the first clock signal input CLK, and a drain electrode of the second TFT T2 is coupled to the source electrode of the first TFT T1.

Figure 10:
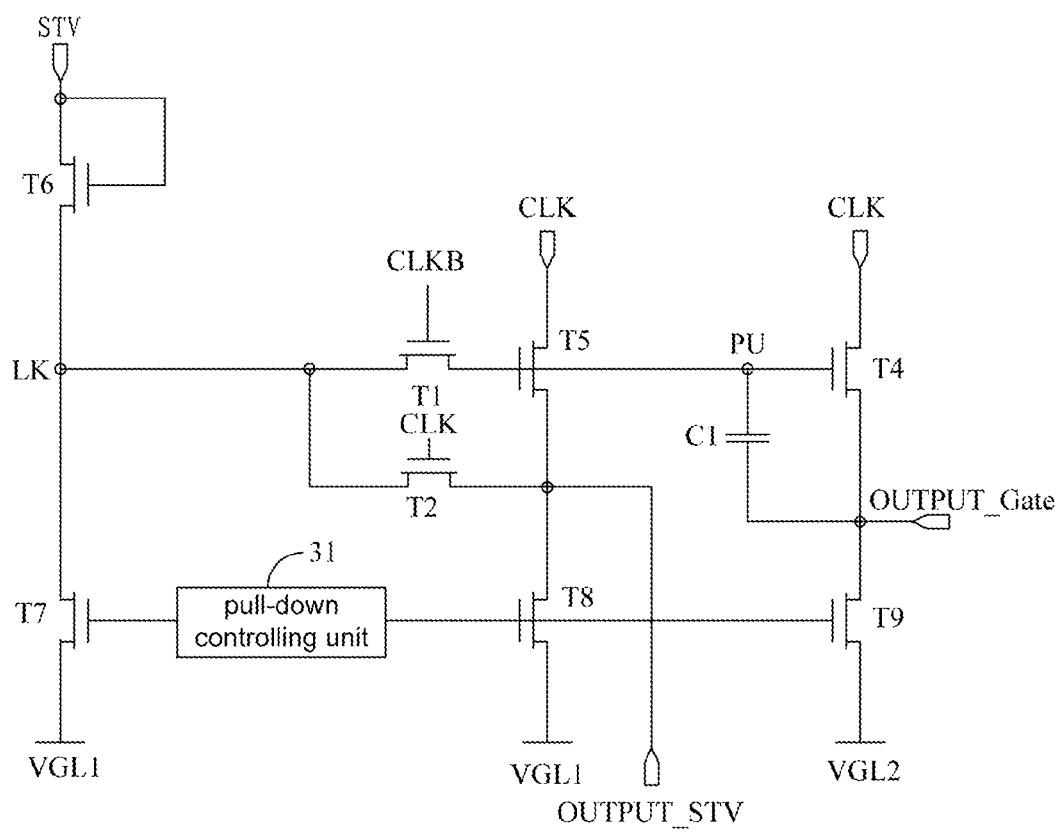
FIG. 10 is yet another schematic view of the shift register unit according to an embodiment of the present invention.

In addition, in an alternative embodiment, the source electrode of the second TFT T2 may be coupled to the second end of the first capacitor C1 and the gate signal output OUTPUT_Gate (i.e., OUTPUT as shown in FIG. 6), or the source electrode of the second TFT T2 may be coupled to the start signal output OUTPUT_STV (as shown in FIG. 10).

When there is a input signal sequence as shown in FIG. 5, the working process of the shift register unit will be described as follows.

At the precharge stage, i.e., stage A, a high level signal is input by the second clock signal input CLKB, the first TFT T1 is in an on state, the pull-up node PU and the first node LK are pulled up to a high potential, a low level signal is input by the first clock signal input CLK, the second TFT T2 is in an off state, a low level signal is output by the signal output OUTPUT, and a voltage at the first node LK is $V_{GH}$.

At the pull-up stage, i.e., stage B, a low level signal is input by the second clock signal input CLKB, the first TFT T1 is in an off stage, a high level signal is input by the first clock signal input CLK, the second TFT T2 is an on stage, and a high level signal is output by the signal output OUTPUT. Because the second TFT T2 is in the on state, the high level signal output by the signal output OUTPUT is fed back to the first node LK. A voltage at the first node LK is about $V_{GH}$, so a gate-to-source voltage $V_{GS}$ of the first TFT T1 is that $V_{GS}=V_{GL}-V_{GH}$. $V_{GL}$ is about −8V, $V_{GH}$ is about 5V and a threshold voltage $V_{TH}$ of the first TFT T1 is about −1V, so at this time, the gate-to-source voltage $V_{GS}$ of the first TFT T1 is approximately to $-13V<V_{TH}<0$, i.e., a deeply negative voltage. Hence, the first TFT T1 is fully switched off, i.e., in a fully off state, and the electrical connection between the pull-up node PU and the first node LK, i.e., electrical connections between the pull-up node PU and the precharge module 2 and between the pull-up node PU and the pull-down module 3, is fully discoupled. As a result, it is able to prevent an incompletely off state of the precharge module 2 and the pull-down module 3 as well as excessive electric leakage due to the depletion features of the TFT, thereby to prevent a failed GOA circuit due to the distortion of the pull-up node PU and of the output waveform of the signal output OUTPUT.

In a circuit as shown in FIG. 6, the gate electrode of the second TFT T2 is coupled to the first clock signal input CLK, while the source electrode of the second TFT T2 is essentially in electrical connection with the first clock signal input CLK too. Hence, there is an alternative mode for the switch-off controlling unit 41 in FIG. 6.

Figure 7:
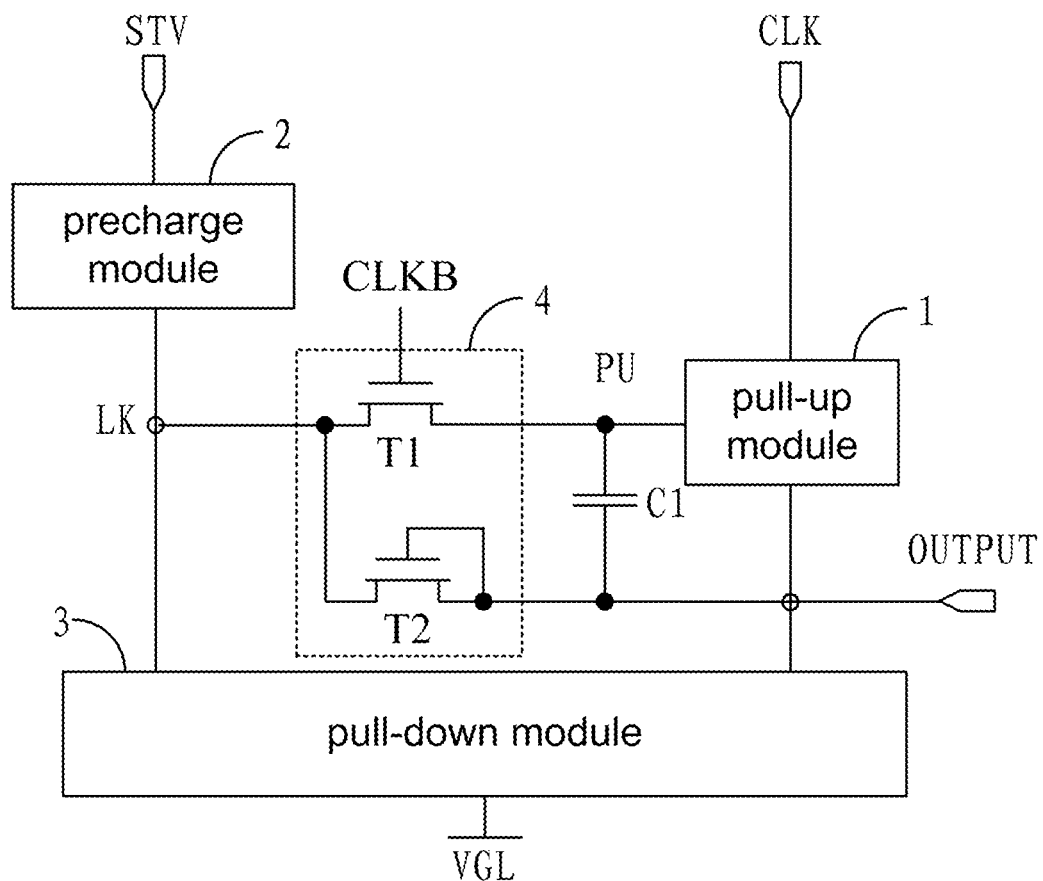
FIG. 7 is yet another schematic view of the shift register unit according to an embodiment of the present invention.

To be specific, as shown in FIG. 7, the source electrode of the second TFT T2 is coupled to the pull-up module 1 and the pull-down module 3, the gate electrode of the second TFT T2 is coupled to the source electrode of the second TFT T2, and the drain electrode of the second TFT T2 is coupled to the source electrode of the first TFT T1.

Figure 11:
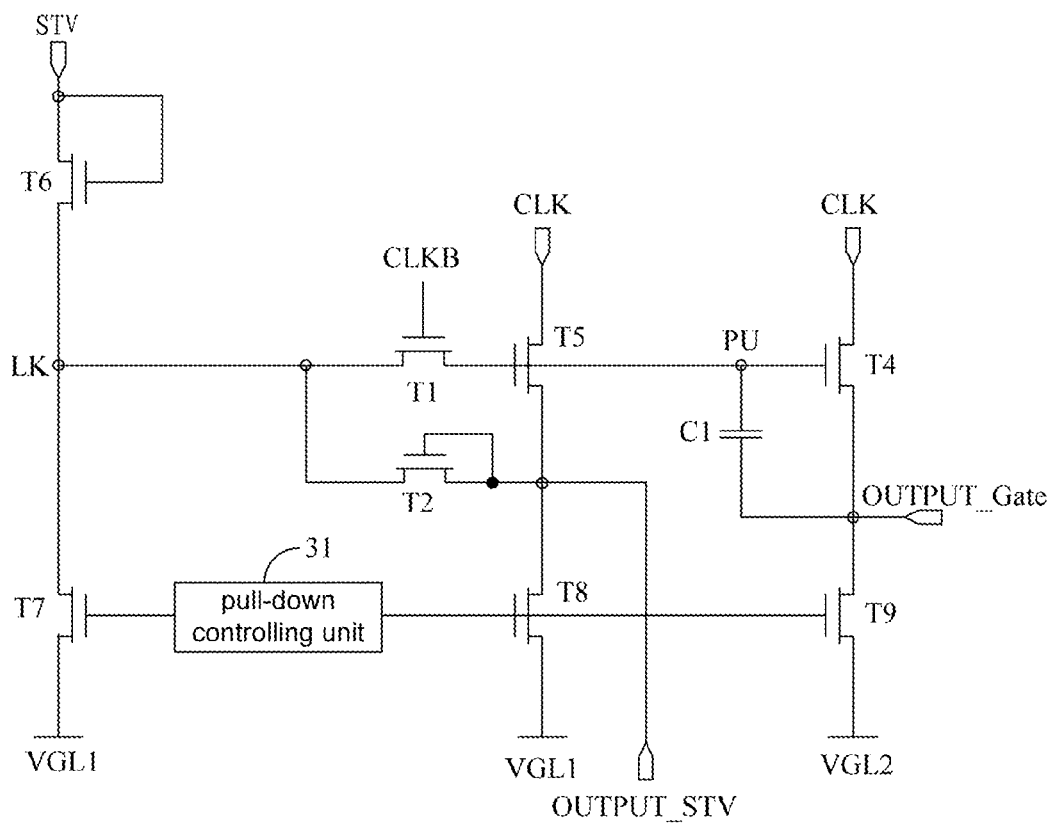
FIG. 11 is yet another schematic view of the shift register unit according to an embodiment of the present invention.

In an alternative embodiment, the source electrode of the second TFT T2 may also be coupled to the second end of the first capacitor C1 and the gate signal output OUTPUT_Gate (i.e., OUTPUT as shown in FIG. 7), or the source electrode of the second TFT T2 may also be coupled to the start signal output OUTPUT_STV (as shown in FIG. 11).

The working process of the shift register unit in FIG. 7 is similar to that of the shift register unit in FIG. 6, i.e., at the pull-up stage, the gate-to-source voltage $V_{GS}$ of the first TFT T1 is approximately equal to $-13V<V_{TH}<0$, i.e., a deeply negative voltage. Hence, in this embodiment, the first TFT T1 may also be fully switched off, i.e., in a fully off state, and the electrical connection between the pull-up node PU and the first node LK, i.e., electrical connections between the pull-up node PU and the precharge module 2 and between the pull-up node PU and the pull-down module 3, may also be fully discoupled. As a result, it is also able to prevent an incompletely off state of the precharge module 2 and the pull-down module 3 as well as excessive electric leakage due to the depletion features of the TFT, thereby to prevent a failed GOA circuit due to the distorted output waveforms from the pull-up node PU and the signal output OUTPUT.

Figure 8:
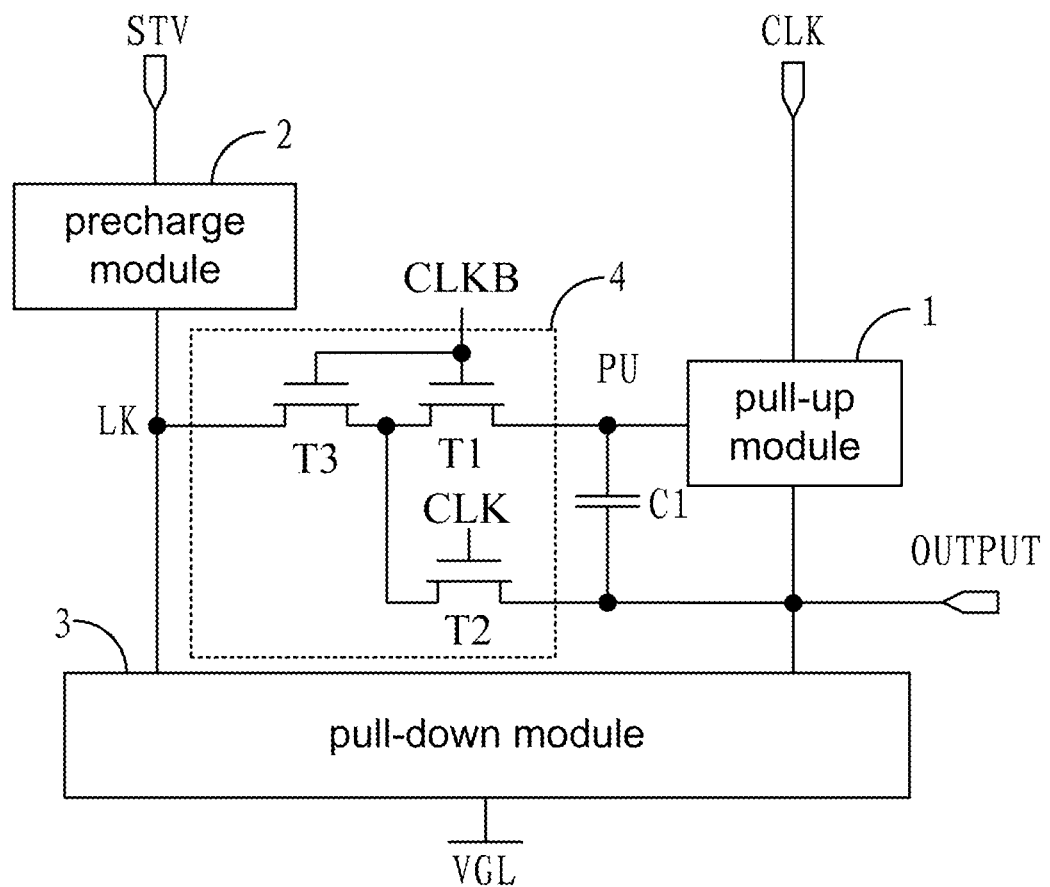
FIG. 8 is yet another schematic view of the shift register unit according to an embodiment of the present invention.
Figure 12:
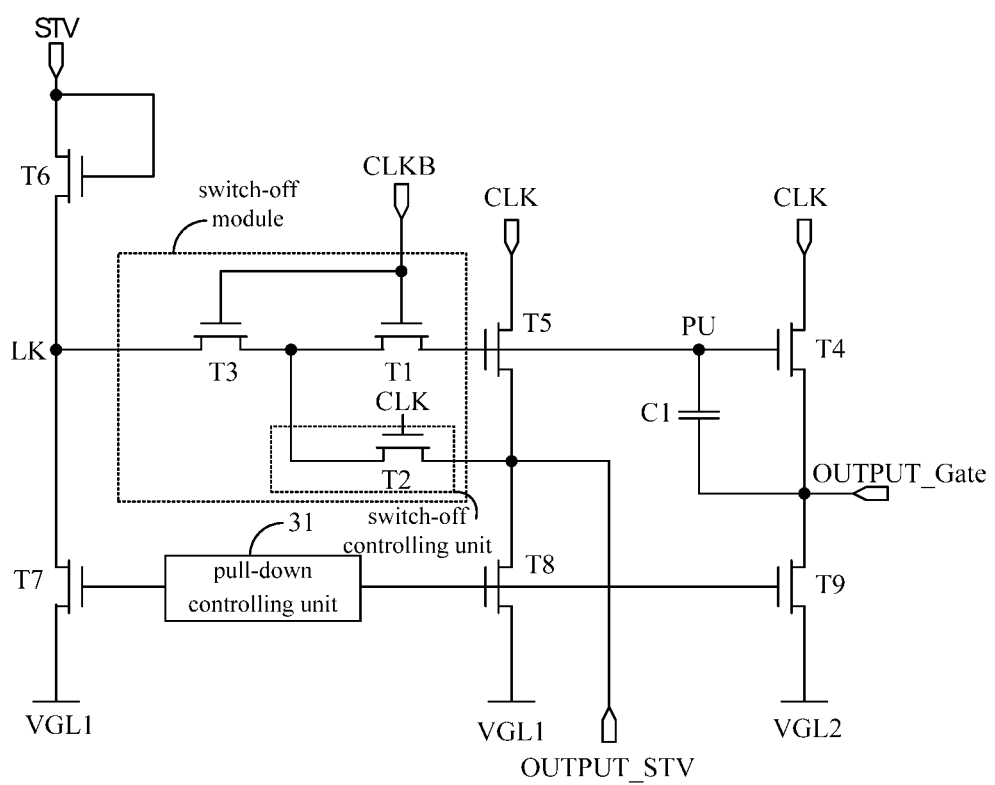
FIG. 12 is yet another schematic view of the shift register unit according to an embodiment of the present invention.

In an embodiment, the switch-off module 4 may have a circuit structure as shown in FIG. 8. In this embodiment, the switch-off module 4 may comprise the first TFT T1, the second TFT T2, and a third TFT T3. The source electrode of the first TFT T1 is coupled to the drain electrode of the second TFT T2 and a drain electrode of the third TFT T3, the gate electrode of the first TFT T1 is coupled to the second clock signal input CLKB, and the drain electrode of the first TFT T1 is coupled to the pull-up node PU. The source electrode of the second TFT T2 is coupled to the pull-up module 1 and the pull-down module 3, and the gate electrode of the second TFT T2 is coupled to the first clock signal input CLK. In an alternative embodiment, the source electrode of the second TFT T2 may also be coupled to the second end of the first capacitor C1 and the gate signal output OUTPUT_Gate (i.e., OUTPUT as shown in FIG. 8), or the source electrode of the second TFT T2 may also be coupled to the start signal output OUTPUT_STV (as shown in FIG. 12).

A source electrode of the third TFT T3 is coupled to the first node LK, and a gate electrode of the third TFT T3 is coupled to the second clock signal input CLKB.

The working process of the shift register unit in FIG. 8 is similar to that of the shift register unit in FIG. 6, i.e., at the pull-up stage, the gate-to-source voltage $V_{GS}$ of the first TFT T1 is approximately equal to $-13V<V_{TH}<0$, i.e., a deeply negative voltage. The first TFT T1 may also be fully switched off, and at the pull-up stage, the third TFT T3 is also in an off state. In other words, there are two transistors in an off-state at the connection link between the pull-up node PU and the first node LK (where the first TFT T1 is in a fully off state), which serves as a belt-and-braces approach for the off state. Hence, the electrical connection between the pull-up node PU and the first node LK, i.e., electrical connections between the pull-up node PU and the precharge module 2 and between the pull-up node PU and the pull-down module 3, may also be fully discoupled. As a result, it is also able to prevent an incompletely off state of the precharge module 2 and the pull-down module 3 as well as excessive electric leakage due to the depletion features of the TFT, thereby to prevent a failed GOA circuit due to the distortion of the pull-up node PU and of the output waveform of the signal output OUTPUT.

In the other embodiments, the shift register unit may have circuit structures as shown in FIGS. 9, 10, 11 and 12.

Figure 13:
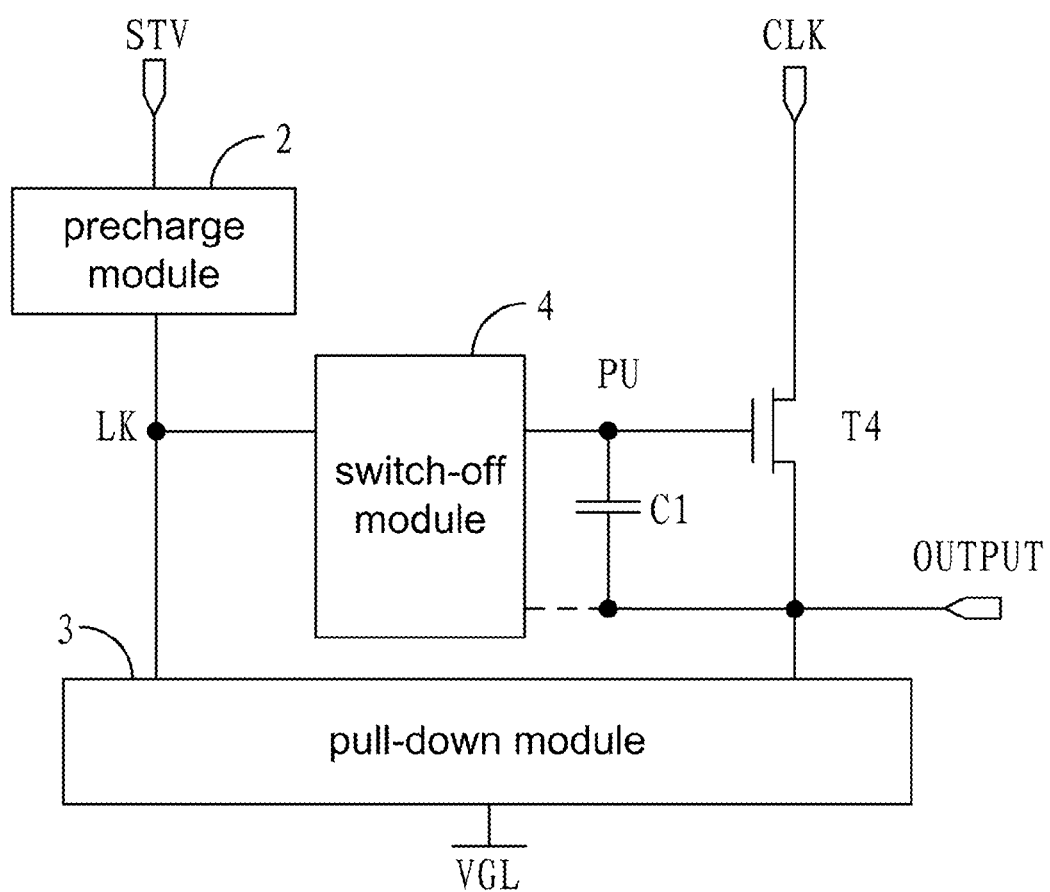
FIG. 13 is yet another schematic view of the shift register unit according to an embodiment of the present invention.

In one embodiment, as shown in FIG. 13, the pull-up module 1 may comprise a fourth TFT T4, a source electrode of the fourth TFT T4 is coupled to the first clock signal input CLK, a gate electrode of the fourth TFT T4 is coupled to the pull-up node PU, and a drain electrode of the fourth TFT T4 is coupled to the second end of the first capacitor C1, the pull-down module 3 and the signal output OUTPUT.

In another embodiment, as shown in FIGS. 9-12, the pull-up module 1 may comprise the fourth TFT T4 and a fifth TFT T5. The source electrode of the fourth TFT T4 is coupled to a source electrode of the fifth TFT T5 and the first clock signal input CLK. The gate electrode of the fourth TFT T4 is coupled to a gate electrode of the fifth TFT T5 and the pull-up node PU. The drain electrode of the fourth TFT T4 is coupled to the gate signal output OUTPUT_Gate, the second end of the first capacitor C1 and the pull-down module 3. A drain electrode of the fifth TFT T5 is coupled to the switch-off module 4, the pull-down module 3 and the start signal output OUTPUT_STV.

As shown in FIGS. 9-12, the precharge module 2 may comprise a sixth TFT T6, a source electrode and a gate electrode of the sixth TFT T6 are coupled to the start signal input STV, and a drain electrode of the sixth TFT T6 is coupled to the switch-off module 4 and the pull-down module 3 at the first node LK.

As shown in FIGS. 9-12, the pull-down module 3 may comprise a seventh TFT T7, an eighth TFT T8, a ninth TFT T9, and a pull-down controlling unit 31 configured to control an on or off state of T7, T8 and T9. A drain electrode of the seventh TFT T7 is coupled to a first level signal input VGL1, a gate electrode of the seventh TFT T7 is coupled to the control unit 31, a gate electrode of the eighth TFT T8 and a gate electrode of the ninth TFT T9 at the pull-down node PD, and a source electrode of the seventh TFT T7 is coupled to the precharge module 2 and the switch-off module 4, i.e., at the first node LK. A drain electrode of the eighth TFT T8 is coupled to the first level signal input VGL1, and a source electrode of the eighth TFT T8 is coupled to the pull-up module 1, the switch-off module 4 and the start signal output OUTPUT_STV. A drain electrode of the ninth TFT T9 is coupled to a second level signal input VGL2, and a source electrode of the ninth TFT T9 is coupled to the pull-up module 1, the second end of the first capacitor C1 and the gate signal output OUTPUT_Gate.

In this embodiment, a potential of an input signal from the second level signal input VGL2 may be less than 0 and greater than a potential of an input signal from the first level signal input VGL1.

Figure 14:
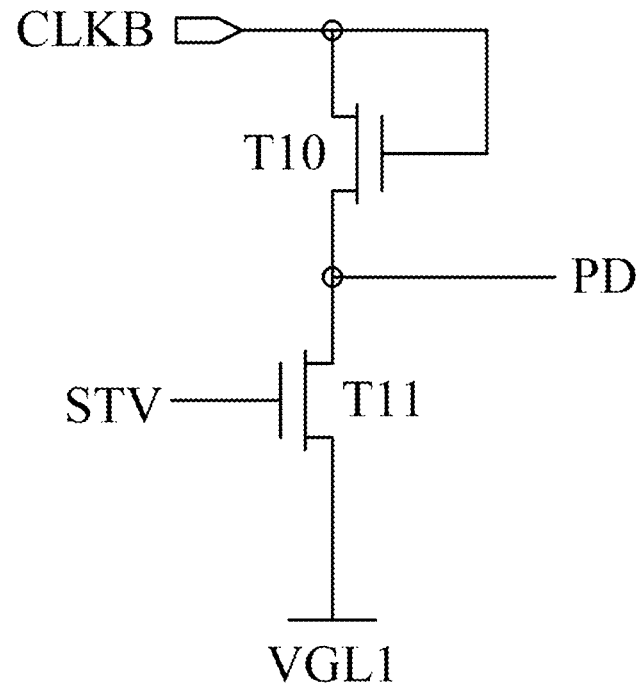
FIG. 14 is a schematic view of a pull-down controlling unit according to an embodiment of the present invention.

In an embodiment, as shown in FIG. 14, the pull-down controlling unit 31 may comprise a tenth TFT T10 and an eleventh TFT T11. A source electrode and a gate electrode of the tenth TFT T10 are coupled to the second clock signal input CLKB, and a drain electrode of the tenth TFT T10 is coupled to the pull-down node PD. A drain electrode of the eleventh TFT T11 is coupled to the pull-down node PD, a gate electrode of the eleventh TFT T11 is coupled to the start signal input STV, and a source electrode of the eleventh TFT T11 is coupled to the first level signal input VGL1.

Figure 15:
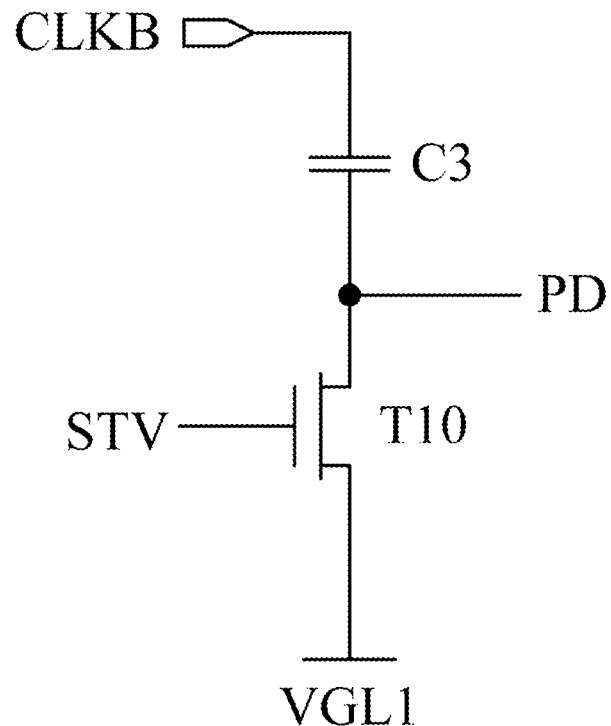
FIG. 15 is another schematic view of the pull-down controlling unit according to an embodiment of the present invention.

In another embodiment, as shown in FIG. 15, the pull-down controlling unit 31 may comprise a third capacitor C3 and the tenth TFT T10. A first end of the third capacitor C3 is coupled to the second clock signal input CLKB, and a second end of the third capacitor C3 is coupled to the pull-down node PD. The drain electrode of the tenth TFT T10 is coupled to the pull-down node PD, the gate electrode of the tenth TFT T10 is coupled to the start signal input STV, and the source electrode of the tenth TFT T10 is coupled to the first level signal input VGL1.

Figure 16:
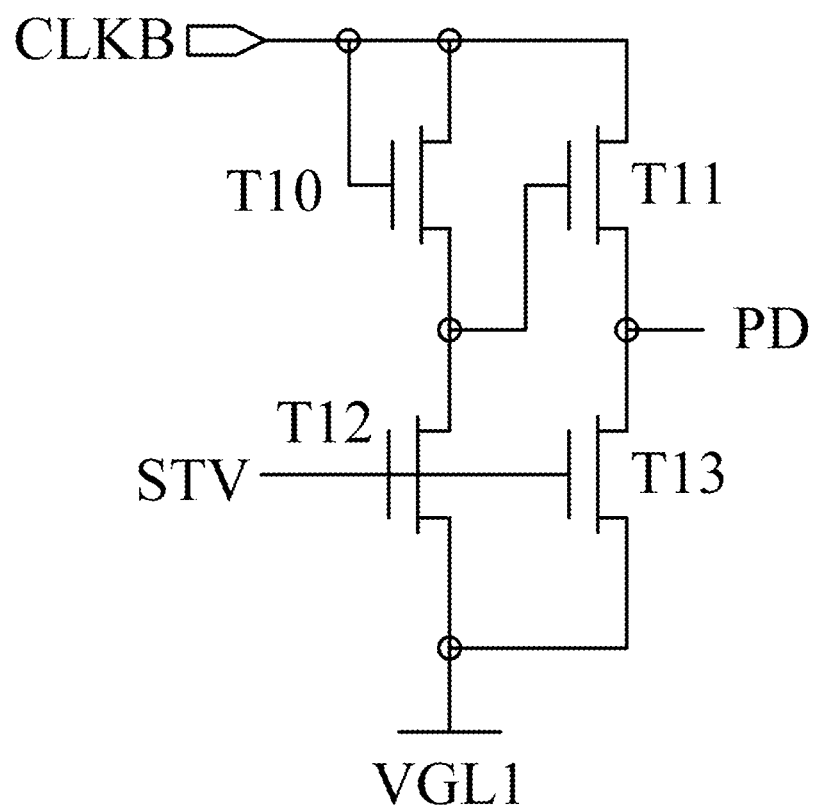
FIG. 16 is yet another schematic view of the pull-down controlling unit according to an embodiment of the present invention.

In another embodiment, as shown in FIG. 16, the pull-down controlling unit 31 may comprise the tenth TFT T10, the eleventh TFT T11, a twelfth TFT T12 and a thirteenth TFT T13. The source electrode and the gate electrode of the tenth TFT T10 are coupled to the second clock signal input CLKB, and the drain electrode of the TFT T10 is coupled to the gate electrode of the eleventh TFT T11 and a drain electrode of the twelfth TFT T12. The source electrode of the eleventh TFT T11 is coupled to the second clock signal input CLKB, and the drain electrode of the eleventh TFT T11 is coupled to the pull-down node PD. A gate electrode of the twelfth TFT T12 is coupled to the start signal input STV and a gate electrode of the thirteenth TFT T13, and a source electrode of the twelfth TFT T12 is coupled to the first level signal input VGL1 and a source electrode of the thirteenth TFT T13. A drain electrode of the thirteenth TFT T13 is coupled to the pull-down node PD.

The TFTs according to embodiments of the present invention may be N-type TFTs.

Figure 17:
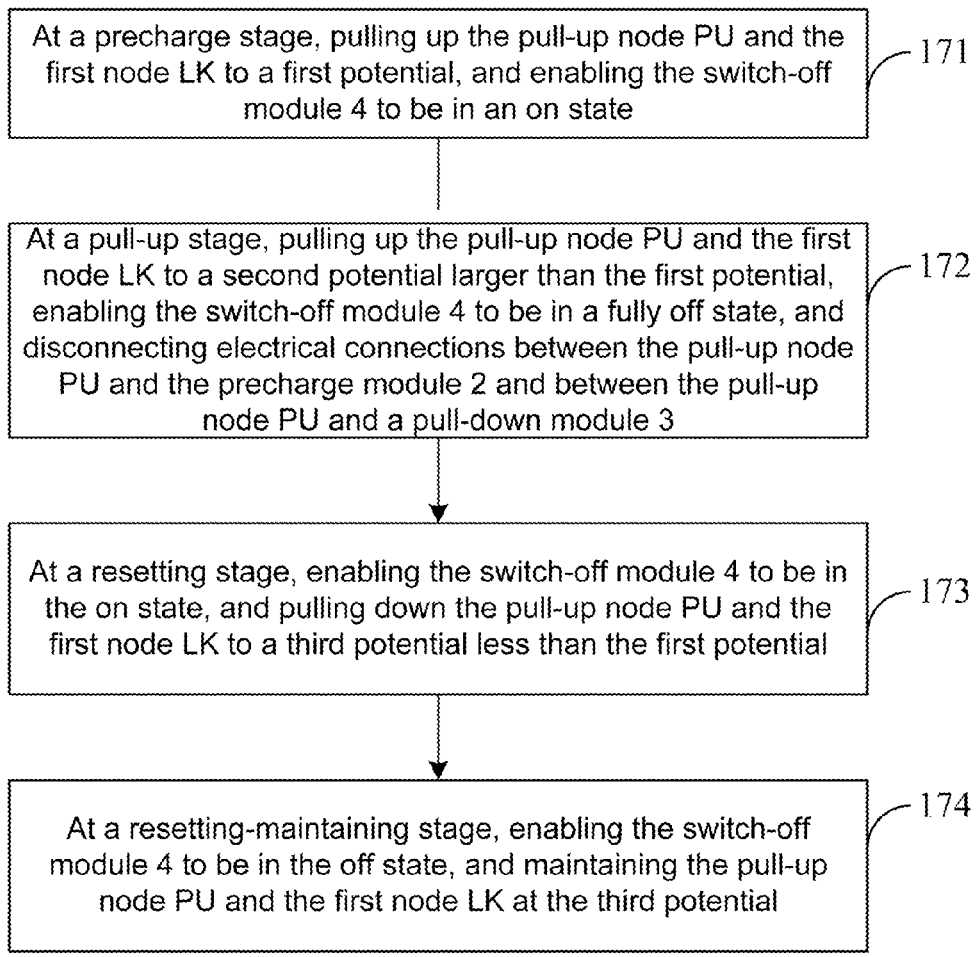
FIG. 17 is a flow chart of a method for driving the shift register unit according to an embodiment of the present invention.

An embodiment of the present invention further provides a method for driving a shift register unit, as shown in FIG. 17, the method comprises: Step 171: at a precharge stage, pulling up the pull-up node PU and the first node LK to a first potential, and enabling the switch-off module 4 to be in an on state; Step 172: at a pull-up stage, pulling up the pull-up node PU and the first node LK to a second potential larger than the first potential, enabling the switch-off module 4 to be in a fully off state, and disconnecting electrical connections between the pull-up node PU and the precharge module 2 and between the pull-up node PU and a pull-down module 3; Step 173: at a resetting stage, enabling the switch-off module 4 to be in the on state, and pulling down the pull-up node PU and the first node LK to a third potential less than the first potential; and Step 174: at a resetting-maintaining stage, enabling the switch-off module 4 to be in the off state, and maintaining the pull-up node PU and the first node LK at the third potential.

Figure 18:
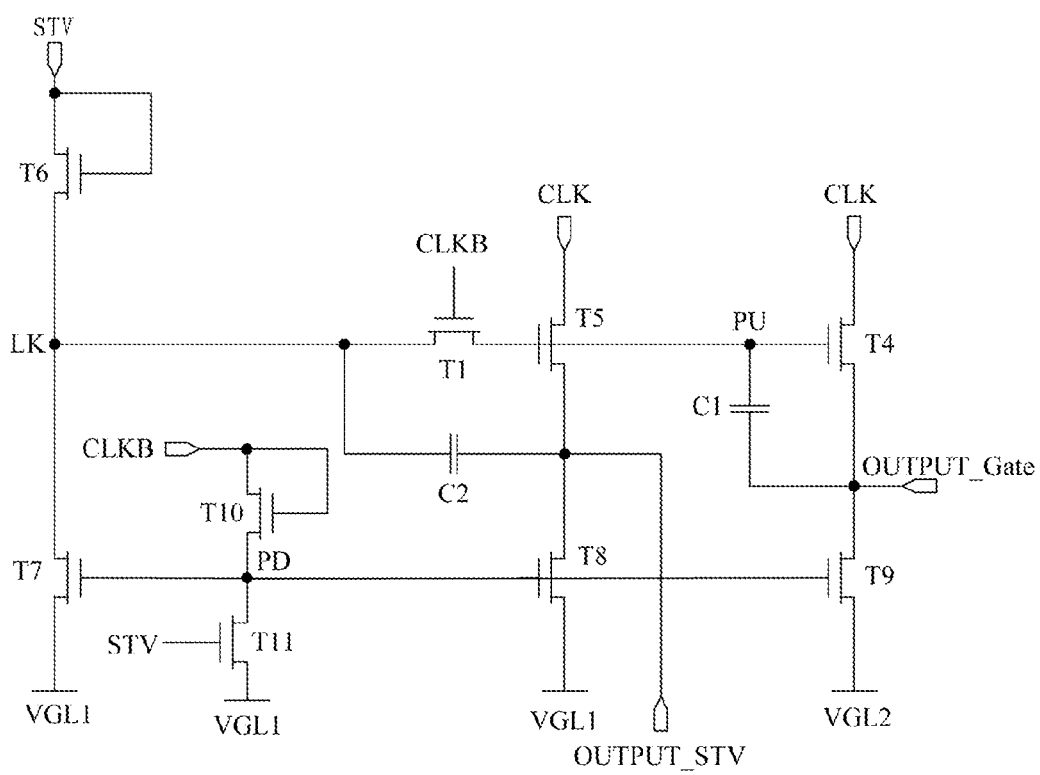
FIG. 18 is yet another schematic view of the shift register unit according to an embodiment of the present invention.

One mode for driving the shift register unit will be described hereinafter by taking the shift register unit in FIG. 18 with the signal sequence in FIG. 5 as an example.

At the precharge stage, i.e., stage A, a low level signal, e.g., $V_{GL}$, is input by the first clock signal input CLK, a high level signal, e.g., $V_{GH}$, is input by the second clock signal input CLKB, and a high level signal, e.g., $V_{GH}$, is input by the start signal input STV. At this time, T1 and T6-T11 are all in an on state, while T4 and T5 are both in an off state. A low level signal $V_{GL2}$ from the second level signal input VGL2 is output by the gate signal output OUTPUT_Gate, a low level signal $V_{GL1}$ from the first level signal input VGL1 is output by the start signal output OUTPUT_STV, and the first node LK and the pull-up node PU are pulled up to a high potential. A voltage at the first node LK may be $V_{GH}-V_{GL1}$, and the potential at the pull-down node PD may be equal to the low level signal $V_{GT1}$ from the first level signal input VGL1.

At the pull-up stage, i.e., stage B, a high level signal, e.g., $V_{GH}$, is input by the first clock signal input CLK, a low level signal, e.g., $V_{GL}$, is input by the second clock signal input CLKB, and a low level signal, e.g., $V_{GL}$, is input by the start signal input STV. At this time, T1 and T6-T11 are all in an off state, while T4 and T5 are in an on state. High level signals are output by both the gate signal output OUTPUT_Gate and the start signal output OUTPUT_STV, and the potentials of the first node LK and the pull-up node PU are further pulled up. At this time, a voltage at the first node LK is $2V_{GH}-V_{GL}$, and the gate-to-source voltage $V_{GS}$ of T1 is that $V_{GS}=V_{GL1}-(2V_{GH}-V_{GT1})=2 V_{GL1}-2 V_{GH}$. Within the conventional numerical ranges, the gate-to-source voltage of T1 is a deeply negative voltage, which is far less than the threshold voltage $V_{TH}$ of T1 and less than 0, i.e., $V_{GS}<V_{TH}<0$. Hence, T1 is fully switched off, i.e., in a fully off state, and the electrical connection between the pull-up node PU and the first node LK, i.e., electrical connections between the pull-up node PU and the precharge module 2 and between the pull-up node PU and the pull-down module 3, is fully discoupled. As a result, it is able to prevent excessive electric leakage at the pull-up node PU due to an incompletely off state of T6 and T7, and to prevent the pull-up node PU from losing the pull-up effect, thereby to prevent the distorted waveform of the output signals from the signal output, i.e., to prevent abnormal output. In addition, the voltage at the pull-down node PD, i.e., the gate voltage of T9, is $V_{GL1}$, and the source electrode of T9 is coupled to the second level signal input, i.e., the source voltage of T9 is $V_{GL2}$. The potential of the input signal $V_{GL2}$ from the second level signal input VGL2 may be less than 0 and greater than that of the input signal $V_{GL1}$ from the first level signal input VGL1, so the gate-to-source voltage of T9 is also a deeply negative voltage, i.e., T9 is also in a fully off state. As a result, there is no electric leakage for the gate signal from the gate signal output OUTPUT_Gate, and it is able to ensure a stable output of the gate signal.

At the resetting stage, i.e., stage C, a low level signal is input by the first clock signal input CLK, a high level signal is input by the second clock signal input CLKB, and a low level signal is input by the start signal input STV. At this time, T1 and T7-T10 are all in an on state, while T4, T5, T6 and T11 are all in an off state. C1 and C2 are discharged through T1 and T7, so as to pull down the potential of the pull-up node PU and the first node LK to $V_{GL1}$. The potential of the output signal from the gate signal output OUTPUT_Gate is pulled down to $V_{GL2}$ through T9, and the potential of the output signal from the start signal output OUTPUT_STV is pulled down to $V_{GL1}$ through T8.

At the resetting-maintaining stage, i.e., stage D, a high level signal is input by the first clock signal input CLK, a low level signal is input by the second clock signal input CLKB, and a low level signal is input by the start signal input STV. At this time, T1 and T6-T11 are all in an off state, while T4 and T5 are in an on state. The pull-up node PU and the first node LK are maintained at a low potential, and the potentials of the output signals from the gate signal output OUTPUT_Gate and the start signal output OUTPUT_STV remain unchanged.

Through the above-mentioned stages in the method for driving the shift register unit according to embodiments of the present invention, the electrical connections between the pull-up node PU and the precharge module 2 and between the pull-up node PU and the pull-down module 3 may be fully discoupled at the pull-up stage. As a result, it is able to prevent excessive electric leakage of the GOA circuit, thereby to improve the reliability and power consumption of the GOA circuit with an Oxide TFT.

Figure 19:
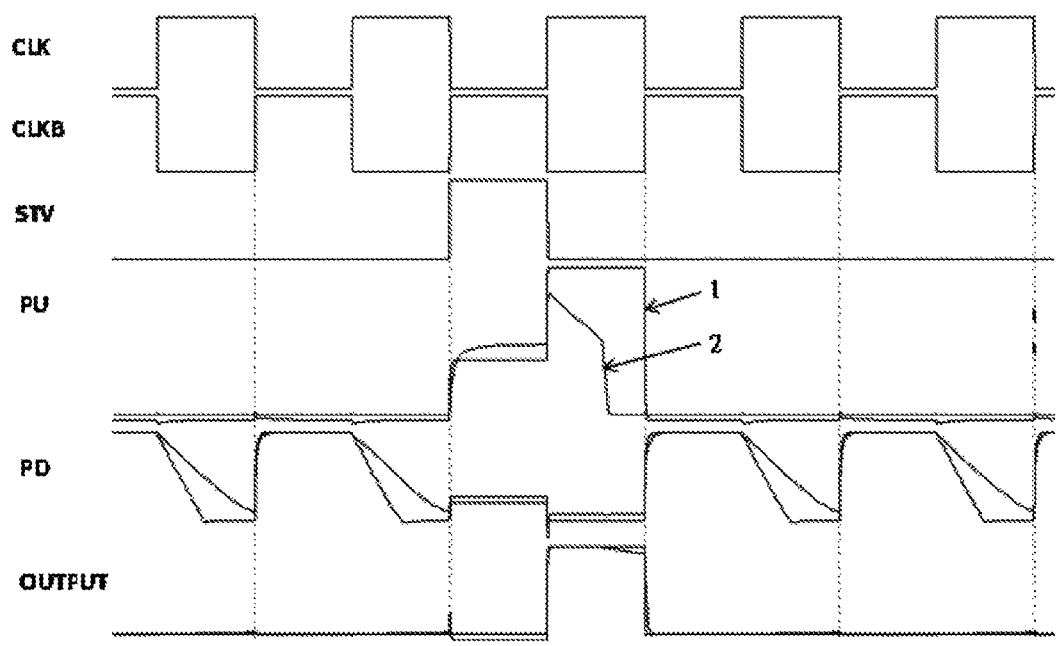
FIG. 19 is a comparison view showing simulation results of output waveforms of a GOA circuit according to an embodiment of the present invention and an existing GOA circuit.

As can be seen from FIG. 19, which is a comparison view showing simulation results of output waveforms of the GOA circuit according to an embodiment of the present invention and an existing GOA circuit (where symbol "1" represents the simulation result of the output waveform of the GOA circuit according to embodiment of the present invention, while symbol "2" represents the simulation result of the output waveform of the existing GOA circuit), at the precharge stage and the pull-up stage, for the existing GOA circuit, there exists excessive electric leakage due to the depletion features of the TFT, and serious attenuation occurs in the pull-up node PU and the output waveform, so the GOA circuit fails. For the GOA circuit according to an embodiment of the present invention, the switch-off module is provided so as to fully disconnect the electrical connections between the pull-up node PU and the precharge module and between the pull-up node PU and the pull-down module at the pull-up stage. As a result, it is able to effectively prevent the electric leakage at the pull-up node PU, thereby to prevent the pull-up node PU and the output waveform from being distorted and to ensure the normal operation of the GOA circuit.

The present invention further provides a shift register comprising multi-levels of the above-mentioned shift register unit.

In an embodiment, apart from the first level, the signal from the gate signal output OUTPUT_Gate of a shift register unit in one level is a resetting signal for the shift register unit in the previous level, and apart from the last level, the signal from the start signal output OUTPUT_STV of a shift register unit in one level is a start signal input by the shift register unit in the next level.

An embodiment of the present invention further provides a display device comprising the above-mentioned shift register.

The display device may be a liquid crystal panel, a liquid crystal TV, a liquid crystal display, an OLED panel, an OLED display, a plasma display or an electronic paper.

The shift register unit, shift register and display device according to embodiments of the present invention are particularly suitable for the GOA circuit under a LTPS process. Of course, they may also be suitable for the GOA circuit under an a-Si process.

It is to be noted that, merely the N-type TFTs are used for the circuit in the above-mentioned embodiments, and P-type TFTs or CMOS TFTs may also be applicable.

According to the shift register unit, the driving method thereof, the shift register and the display device of the present invention, the switch-off module is provided so as to disconnect the electrical connections between the pull-up node and the precharge module and between the pull-up node and the pull-down module at the pull-up stage. As a result, it is able to prevent excessive electric leakage of the GOA circuit, thereby to improve the reliability and power consumption of the GOA circuit with an Oxide TFT.

The above are merely the preferred embodiments of the present invention. It should be noted that, a person skilled in the art may make further improvements and modifications without departing from the principle of the present invention, and these improvements and modifications shall also be considered as the scope of the present invention.

What is claimed is:

1. A shift register unit comprising a first capacitor, a pull-up module, a precharge module and a pull-down module, a first end of the first capacitor being coupled to the pull-up module at a pull-up node, the shift register unit further comprising:
   a switch-off module coupled to the pull-up node and to a first node located between the precharge module and the pull-down module, configured to disconnect electrical connections (i) between the pull-up node and the precharge module and (ii) between the pull-up node and the pull-down module at a pull-up stage,
   wherein the switch-off module comprises:
      a first TFT, a source electrode of the first TFT is coupled to the first node, a gate electrode of the first TFT is coupled to a second clock signal input, and a drain electrode of the first TFT is coupled to the pull-up node; and
      a switch-off controlling unit configured to control a source voltage of the first TFT at the pull-up stage so as to enable the first TFT to be in a fully off state, thereby to disconnect the electrical connections (i) between the pull-up node and the precharge module and (ii) between the pull-up node and the pull-down module.

2. The shift register unit according to claim 1, wherein the switch-off controlling unit comprises:
   a feedback capacitor, a first end of the feedback capacitor is coupled to the source electrode of the first TFT, and a second end of the feedback capacitor is coupled to the pull-up module and the pull-down module.

3. The shift register unit according to claim 1, wherein the switch-off controlling unit further comprises:
   a second TFT, a source electrode of the second TFT is coupled to the pull-up module and the pull-down module, a gate electrode of second TFT is coupled to a first clock signal input, and a drain electrode of second TFT is coupled to the source electrode of the first TFT.

4. The shift register unit according to claim 1, wherein the switch-off controlling unit further comprises:
   a second TFT, a source electrode of second TFT is coupled to the pull-up module and the pull-down module, a gate electrode of second TFT is coupled to the source electrode of the second TFT, and a drain electrode of second TFT is coupled to the source electrode of the first TFT.

5. The shift register unit according to claim 1, wherein the switch-off controlling unit comprises a second TFT, and the switch-off module further comprises a third TFT,
   the source electrode of the first TFT is coupled to a drain electrode of the second TFT and a drain electrode of the third TFT
   a source electrode of the second TFT is coupled to the pull-up module and the pull-down module, and a gate electrode of the second TFT is coupled to a first clock signal input; and
   a source electrode of the third TFT is coupled to the first node, and a gate electrode of the third TFT is coupled to the second clock signal input.

6. The shift register unit according to claim 1, wherein the pull-up module comprises:
   a fourth TFT, a source electrode of the fourth TFT is coupled to a first clock signal input, a gate electrode of the fourth TFT is coupled to the pull-up node, and a drain electrode of the fourth TFT is coupled to a second end of the first capacitor, the pull-down module and a signal output.

7. The shift register unit according to claim 1, wherein the pull-up module comprises:
a fourth TFT and a fifth TFT,
wherein:
a source electrode of the fourth TFT is coupled to a source electrode of the fifth TFT and a first clock signal input;
a gate electrode of the fourth TFT is coupled to a gate electrode of the fifth TFT and the pull-up node;
a drain electrode of the fourth TFT is coupled to a gate signal output, a second end of the first capacitor and the pull-down module; and
a drain electrode of the fifth TFT is coupled to the switch-off module, the pull-down module and a start signal output.

8. The shift register unit according to claim 1, wherein the precharge module comprises:
a sixth TFT, a source electrode and a gate electrode of the sixth TFT are coupled to a start signal input, and a drain electrode of the sixth TFT is coupled to the switch-off module and the pull-down module.

9. The shift register unit according to claim 1, wherein the pull-down module comprises:
a seventh TFT, an eighth TFT, a ninth TFT, and a pull-down controlling unit configured to control an on or off state of the seventh, eighth and ninth TFTs,
wherein:
a source electrode of the seventh TFT is coupled to the precharge module and the switch-off module, a gate electrode of the seventh TFT is coupled to the pull-down controlling unit, a gate electrode of the eighth TFT and a gate electrode of the ninth TFT at a pull-down node, and a drain electrode of the seventh TFT is coupled to a first level signal input;
a source electrode of the eighth TFT is coupled to the pull-up module, the switch-off module and a start signal output, and a drain electrode of the eighth TFT is coupled to the first level signal input; and
a source electrode of the ninth TFT is coupled to the pull-up module, a second end of the first capacitor, and a gate signal output, and a drain electrode of the ninth TFT is coupled to a second level signal input.

10. The shift register unit according to claim 9, wherein a potential of an input signal from the second level signal input is less than 0 and greater than a potential of an input signal from the first level signal input.

11. The shift register unit according to claim 9, wherein the pull-down controlling unit comprises a tenth TFT and an eleventh TFT, wherein:
a source electrode and a gate electrode of the tenth TFT are coupled to the second clock signal input, and a drain electrode of the tenth TFT is coupled to the pull-down node, and
a drain electrode of the eleventh TFT is coupled to the pull-down node, a gate electrode of the eleventh TFT is coupled to a start signal input, and a source electrode of the eleventh TFT is coupled to the first level signal input.

12. The shift register unit according to claim 9, wherein the pull-down controlling unit comprises a third capacitor and a tenth TFT, wherein:
a first end of the third capacitor is coupled to the second clock signal input, and a second end of the third capacitor is coupled to the pull-down node, and
a drain electrode of the tenth TFT is coupled to the pull-down node, a gate electrode of the tenth TFT is coupled to a start signal input, and a source electrode of the tenth TFT is coupled to the first level signal input.

13. The shift register unit according to claim 9, wherein the pull-down controlling unit comprises a tenth TFT, an eleventh TFT, a twelfth TFT and a thirteenth TFT, wherein:
a source electrode and a gate electrode of the tenth TFT are coupled to the second clock signal input, and a drain electrode of the tenth TFT is coupled to a gate electrode of the eleventh TFT and a drain electrode of the twelfth TFT,
a source electrode of the eleventh TFT is coupled to the second clock signal input, and a drain electrode of the eleventh TFT is coupled to the pull-down node,
a gate electrode of the twelfth TFT is coupled to a start signal input and a gate electrode of the thirteenth TFT, and a source electrode of the twelfth TFT is coupled to the first level signal input and a source electrode of the thirteenth TFT, and
a drain electrode of the thirteenth TFT is coupled to the pull-down node.

14. A method for driving the shift register unit according to claim 1, the method comprising:
at a precharge stage, pulling up a pull-up node and a first node to a first potential, and enabling a switch-off module to be in an on state;
at a pull-up stage, pulling up the pull-up node and the first node to a second potential greater than the first potential, enabling the switch-off module to be in a fully off state, and disconnecting electrical connections between the pull-up node and a precharge module and between the pull-up node and a pull-down module;
at a resetting stage, enabling the switch-off module to be in the on state, and pulling down the pull-up node and the first node to a third potential less than the first potential; and
at a resetting-maintaining stage, enabling the switch-off module to be in the off state, and maintaining the pull-up node and the first node at the third potential.

15. The method according to claim 14, wherein:
at the precharge stage, a low level signal is input by a first clock signal input, a high level signal is input by the second clock signal input, and a high level signal is input by a start signal input;
at the pull-up stage, a high level signal is input by the first clock signal input, a low level signal is input by the second clock signal input, and a low level signal is input by the start signal input;
at the resetting stage, a low level signal is input by the first clock signal input, a high level signal is input by the second clock signal input, and a low level signal is input by the start signal input; and
at the resetting-maintaining stage, a high level signal is input by the first clock signal input, a low level signal is input by the second clock signal input, and a low level signal is input by the start signal input.

16. A display device, comprising multi-levels of shift register unit according to claim 1.

17. A shift register unit comprising: a first capacitor, a pull-up module, a precharge module, and a pull-down module, a first end of the first capacitor being coupled to the pull-up module at a pull-up node, the shift register unit further comprising:
a switch-off module coupled to the pull-up node and to a first node located between the precharge module and the pull-down module, configured to disconnect electrical connections (i) between the pull-up node and the precharge module and (ii) between the pull-up node and the pull-down module at a pull-up stage;

wherein the switch-off module comprises:
a first TFT, a second TFT, and a third TFT, wherein:
  a source electrode of the first TFT is coupled to a drain electrode of the second TFT and a drain electrode of the third TFT, a gate electrode of the first TFT is coupled to a second clock signal input, and a drain electrode of the first TFT is coupled to the pull-up node;
  a source electrode of the second TFT is coupled to the pull-up module and the pull-down module, and a gate electrode of the second TFT is coupled to a first clock signal input; and
  a source electrode of the third TFT is coupled to the first node, and a gate electrode of the third TFT is coupled to the second clock signal input.

* * * * *